United States Patent
Pares et al.

(10) Patent No.: US 11,990,678 B2
(45) Date of Patent: May 21, 2024

(54) STACK FOR FABRICATING AN INTEGRATED CIRCUIT INTENDED TO PERFORM AN ELECTROMAGNETIC-LENS FUNCTION FOR A RECONFIGURABLE TRANSMITARRAY ANTENNA

(71) Applicant: COMMISSARIAT A L'ENERGIE ATOMIQUE ET AUX ENERGIES ALTERNATIVES, Paris (FR)

(72) Inventors: Gabriel Pares, Grenoble (FR); Antonio Clemente, Grenoble (FR); Bruno Reig, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 10 days.

(21) Appl. No.: 17/804,738

(22) Filed: May 31, 2022

(65) Prior Publication Data
US 2022/0384963 A1    Dec. 1, 2022

(30) Foreign Application Priority Data
Jun. 1, 2021 (FR) .................... 21 05741

(51) Int. Cl.
*H01Q 21/00* (2006.01)
*H01L 23/528* (2006.01)
(Continued)

(52) U.S. Cl.
CPC ..... *H01Q 21/0025* (2013.01); *H01L 23/5286* (2013.01); *H01Q 1/24* (2013.01);
(Continued)

(58) Field of Classification Search
CPC ...... H01Q 21/0025; H01Q 1/24; H01Q 15/02; H01Q 21/0087; H01Q 21/065; H01Q 1/38;
(Continued)

(56) References Cited

U.S. PATENT DOCUMENTS 11,296,423 B2 *   4/2022   Gonzalez ........... H01Q 21/0093
2018/0301807 A1 * 10/2018   Clemente ................. H01Q 3/34
2019/0348756 A1 * 11/2019   Liu .......................... H01Q 9/16

OTHER PUBLICATIONS

French Preliminary Search Report dated Feb. 9, 2022 in French Application 21 05741 filed on Jun. 1, 2021 (with English Translation of Categories of Cited Documents & Written Opinion), 14 pages.

* cited by examiner

*Primary Examiner* — Hoang V Nguyen
*Assistant Examiner* — Aladdin Abdulbaki
(74) *Attorney, Agent, or Firm* — Oblon, McClelland, Maier & Neustadt, L.L.P.

(57) ABSTRACT

A stack for fabricating an integrated circuit intended to perform an electromagnetic-lens function for a reconfigurable transmitarray antenna, the stack including in succession: a substrate that includes a set of first active components configured to generate a phase shift, and that has first and second opposite surfaces, the first active components being integrated monolithically into the substrate; a metal layer, forming a ground plane on the first surface of the substrate; a layer of a cured polymer, formed on the metal layer; vias that are electrically insulated from the metal layer and that are arranged to electrically connect pairs of planar antennas, each electrically connected pair of planar antennas including first and second planar antennas that are aligned along the normal to the first and second surfaces of the substrate.

15 Claims, 7 Drawing Sheets

(51) Int. Cl.
*H01Q 1/24* (2006.01)
*H01Q 15/02* (2006.01)
*H01Q 21/06* (2006.01)
*H05K 1/02* (2006.01)

(52) U.S. Cl.
CPC ......... *H01Q 15/02* (2013.01); *H01Q 21/0087* (2013.01); *H01Q 21/065* (2013.01); *H05K 1/0243* (2013.01); *H05K 2201/10098* (2013.01)

(58) Field of Classification Search
CPC .......... H01Q 21/08; H01Q 9/04; H01Q 23/00; H01Q 3/34; H01Q 1/48; H01Q 15/24; H01Q 9/0407; H01L 23/5286; H05K 1/0243; H05K 2201/10098; H05K 1/00; H05K 3/30
See application file for complete search history.

STACK FOR FABRICATING AN INTEGRATED CIRCUIT INTENDED TO PERFORM AN ELECTROMAGNETIC-LENS FUNCTION FOR A RECONFIGURABLE TRANSMITARRAY ANTENNA

TECHNICAL FIELD

The invention relates to the technical field of transmitarray antennas. A transmitarray antenna comprises:
- a transmitarray (also called an electromagnetic lens or discrete lens), comprising a set of elementary cells able to be arranged in a matrix array (the matrix array may be regular or sparse; the regular matrix array may for example have a square or triangular unit cell);
- at least one radiating source (called the primary source), arranged to irradiate the transmitarray.

Each elementary cell of the transmitarray is capable of shifting the phase of the incident wave emitted by the primary source or sources, in order to compensate for each of the differences in the path of the emitted radiation between the primary source or sources and the transmitarray. The elementary cells allow the phase relationship required to form the radiation pattern desired for the antenna to be obtained in the radiating aperture.

More precisely, each elementary cell of the transmitarray may comprise at least:
- a first planar antenna (called the receive antenna), arranged to receive the incident wave emitted by the primary source or sources;
- a second planar antenna (called the transmit antenna), arranged to transmit, with a phase shift, the incident wave received by the first planar antenna.

By "planar antenna", what is meant is an electrically conductive planar surface (conventionally made of metal) able to emit/receive electromagnetic radiation. One example of a planar antenna is a micro-strip patch antenna.

Other elementary-cell architectures may also be used, such as multilayer structures based on the concept of frequency-selective surfaces, or on the concept of Fabry-Perot cavities. Radiating elements such as dipoles, slots etc. may also be used in the elementary cell.

It will be noted that an elementary cell of a transmitarray is able to operate in receive mode or in transmit mode, that is to say that the first planar antenna of the elementary cell may also be a transmit antenna, while the second planar antenna of the elementary cell may also be a receive antenna.

The invention may notably be employed to obtain a reconfigurable antenna. By "reconfigurable", what is meant is that at least one characteristic of the antenna may be modified during its lifetime, after it has been manufactured. The one or more characteristics generally able to be modified are frequency response (in amplitude and in phase), radiation pattern (also called beam), and polarization. Frequency-response reconfiguration covers various functionalities such as frequency switching, frequency tuning, bandwidth modification, phase-shift generation, frequency-domain filtering, etc. Radiation-pattern reconfiguration covers various functionalities, such as angular scan of beam pointing direction, modification of beam opening angle typically defined at half-power (i.e. the concentration of the radiation in a particular direction), spatial filtering (which is related to opening angle and to how the beam is formed), beamforming or multi-beamforming (e.g. a plurality of narrow beams replacing a wide beam), etc. A reconfigurable transmitarray antenna is particularly advantageous from the C band (4-8 GHz) up to the W band (75-110 GHz), or even the D band (110-170 GHz) or up to the 300 GHz band, for the following applications:
- automotive radars for driver assistance, from an active safety perspective,
- very-high-resolution imaging and surveillance systems,
- very-high-rate communication systems, operating notably in millimetre bands (inter-building or intra-building communications in a home-automation or building-automation context, and particularly suitable for monitoring users),
- Ka-band telemetry links between low-earth-orbit (LEO) satellites and ground, satellite telecommunications with a reconfigurable primary source (SOTM™ for "satellite communications on the move", Internet, television, etc.),
- point-to-point and point-to-multipoint communication systems (metropolitan networks, fronthaul and backhaul systems for cellular networks, radio access for fifth-generation mobile networks, etc.).

PRIOR ART

Millimetre frequency bands are very advantageously employed in radio communication systems because the available spectral bands are wide, permitting high transmission rates. For example, the band around 60 GHz (57-66 GHz) is a free band, i.e. it is able to be used without a licence worldwide, and hence is of great interest. Wireless communications at around 60 GHz are however limited:
- on the one hand, by resonance of dioxygen molecules present in the air, which absorb most of the energy transmitted by the radio communication system,
- on the other hand, by losses related to free-space path loss, which increase as the square of operating frequency:

$$FSPL = \left(\frac{4\pi d f}{c}\right)^2$$

where "d" is the distance between two antennas, "f" is operating frequency, and "c" is the speed of electromagnetic waves (i.e. their speed of propagation through free space).

As a result, the radio communication system requires a high gain. This underlying problem is shared by millimetre and sub-THz frequencies above 30 GHz.

It is known in the prior art, in particular from the doctoral thesis of J. A. Zevallos Luna, "Intégration d'antennes pour objets communicants aux fréquences millimétriques" [Antenna integration for objects communicating at millimetre frequencies], October 2014 (D1 below), to associate a transceiver module with a passive transmitarray (see FIG. 6.1 of D1, and section 5.4). The transmitarray is printed on a dielectric substrate (see FIG. 6.2 a) of D1). The integrated circuit of the transceiver is formed on a printed circuit board. The transmitarray is formed on the printed circuit board, facing the transceiver, by way of dielectric pillars that support the dielectric substrate.

This prior-art solution is not entirely satisfactory in so far as the dielectric pillars decrease the compactness of the radio communication system. Furthermore, the obtained antenna is not reconfigurable because of the passive transmitarray.

SUMMARY OF THE INVENTION

The invention aims to completely or partially remedy the aforementioned drawbacks. To this end, one subject of the invention is a stack for fabricating an integrated circuit intended to perform an electromagnetic-lens function for a reconfigurable transmitarray antenna, the stack comprising in succession:

- a substrate that comprises a set of first active components configured to generate a phase shift, and that has first and second opposite surfaces, the first active components being integrated monolithically into the substrate;
- a metal layer, forming a ground plane on the first surface of the substrate;
- a layer of a cured polymer, formed on the metal layer;

the stack comprising:

- a first interconnect structure formed on the second surface of the substrate, and electrically connected to the first active components, the first interconnect structure comprising first biasing lines arranged to bias the first active components;
- a set of first planar antennas that is formed on the first interconnect structure so as to be electrically connected to the first active components;
- a set of second planar antennas that is formed on the layer of a cured polymer, the sets of first and second planar antennas being aligned along the normal to the first and second surfaces of the substrate;
- vias that are electrically insulated from the metal layer and that are arranged to electrically connect pairs of planar antennas, each electrically connected pair of planar antennas comprising first and second planar antennas that are aligned along the normal to the first and second surfaces of the substrate.

Definitions

By "electromagnetic lens", what is meant is a transmitarray (also called a discrete lens).

By "substrate", what is meant is a self-supporting physical carrier, made of a base material allowing monolithic integration of the first active components. The substrate may be a wafer, generally a disc-shaped wafer obtained by cutting an ingot of a crystalline material.

By "active components", what is meant is components that act, depending on a control signal (e.g. electronic or optical signal), on the propagation characteristics of an electromagnetic wave. The active components may be integrated monolithically into the substrate in the FEOL portion of a production line (FEOL being the acronym of front end of line) for example using photolithography techniques, etching techniques, dopant-implantation and -diffusion techniques, metal-deposition techniques, passivation techniques, etc. The active components are preferably switches.

By "phase shift", what is meant is a modification of the phase of an incident electromagnetic wave generated by the one or more active components, for example by delaying (temporal shift) the incident electromagnetic wave.

By "ground plane", what is meant is a metal region that forms an electrical ground plane so as to define a reference potential.

By "cured polymer", what is meant is the product obtained at the end of moulding of a polymer, or in other words the moulded polymer. The polymer may be a thermoplastic or a thermoset, the latter being preferred.

By "interconnect structure", what is meant is a stack of interconnect levels comprising metal tracks embedded in a dielectric. An interconnect structure may be formed on the substrate in the BEOL portion of a production line (BEOL being the acronym of back end of line).

By "planar antenna", what is meant is an electrically conductive planar surface (conventionally made of metal) able to emit/receive electromagnetic radiation. One example of a planar antenna is a micro-strip patch antenna.

The expression "a set of second planar antennas that is formed on the layer of a cured polymer" does not necessarily mean that the second planar antennas are formed directly on the layer of a cured polymer. This expression does not exclude the presence of an entity (an interconnect structure for example) between the layer of a cured polymer and the second planar antennas.

By via, what is meant is a metallized hole allowing an electrical connection to be made between various interconnect levels.

Thus, such a stack according to the invention enables monolithic integration of the elementary cells of the transmitarray with the first active components allowing the phase shift generated in the corresponding cell to be controlled and modified, with a view to making it possible to obtain a reconfigurable antenna.

Furthermore, such a monolithic integration enables future production of an integrated circuit which is small enough to be compatible with reconfigurable-antenna operating frequencies above 30 GHz. Specifically, in order to obtain a satisfactory performance, the characteristic dimension (and therefore the periodicity) of the elementary cells must be smaller than or equal to the half-wavelength of the electromagnetic waves transmitted by the one or more primary sources. For example, when the operating frequency is 30 GHz, the characteristic dimension of the elementary cells must be smaller than or equal to 0.5 cm.

The stack according to the invention may comprise one or more of the following features.

According to one feature of the invention, the stack comprises demultiplexers that are encapsulated in the layer of a cured polymer and that are off-axis with respect to the electrically connected pairs of planar antennas, the demultiplexers being electrically connected to the first biasing lines with a view to transmission of a control signal.

One advantage thereof is that the demultiplexers may be integrated monolithically with the elementary cells of the transmitarray and with the first active components. The layer of a cured polymer plays the role of an integrated-circuit package. The demultiplexers may be integrated monolithically with the layer of a cured polymer by virtue of a fan-out wafer-level packaging technique. The expression "fan-out" means that it is possible to obtain a package with additional interconnects lying beyond the pads of the chip (e.g. a demultiplexer chip) encapsulated in the package. In other words, the interconnects of the package may lie beyond the area of the chip encapsulated in the package (and more precisely beyond the orthogonal projection of the area of the chip in the plane of the interconnects of the package). In contrast, fan-in is spoken of when the interconnects of the package (e.g. solder bumps) are circumscribed by the area of the chip encapsulated in the package. In other words, the interconnects of the package lie within the limits of the area of the chip (and more precisely within the limits of the orthogonal projection of the area of the chip in the plane of the interconnects of the package).

The demultiplexers are off-axis with respect to the electrically connected pairs of planar antennas so as not to hinder propagation of incident waves.

According to one feature of the invention, the set of first active components comprises pairs of switches, each pair of switches being associated with one first planar antenna, the first active components preferably being chosen from a diode, a field-effect transistor, a bipolar transistor, and a micro-electromechanical system.

Definition

By "switches", what is meant is elements that allow the flow of an electrical current, for example between two separate radiating areas of a planar antenna, to be permitted or prevented.

One advantage thereof is that a phase shift may be generated by modifying the effective electrical length of the first planar antenna.

According to one feature of the invention, the stack comprises a second interconnect structure intermediate between the layer of a cured polymer and the set of second planar antennas, in which stack:
  the layer of a cured polymer has a surface that is oriented toward the second interconnect structure and equipped with a set of second active components that are configured to generate a phase shift;
  the second interconnect structure is electrically connected to the second active components and comprises second biasing lines that are arranged to bias the second active components;
  the set of second planar antennas is formed on the second interconnect structure so as to be electrically connected to the second active components.

One advantage thereof is that the number of phase or delay states may be increased.

According to one feature of the invention, the set of second active components comprises pairs of switches, each pair of switches being associated with one second planar antenna, the second active components preferably being chosen from a diode, a field-effect transistor, a bipolar transistor, and a micro-electromechanical system.

One advantage thereof is that a phase shift may be generated by modifying the effective electrical length of the second planar antenna.

According to one feature of the invention, the demultiplexers are electrically connected to the second biasing lines.

One advantage thereof is that the second active components may be controlled.

According to one feature of the invention:
  each second planar antenna comprises separate first and second radiating areas;
  the first radiating areas of the second planar antennas are electrically connected to the vias and to the second active components;
  the second radiating areas of the second planar antennas are electrically connected to the second active components.

Definition

By "separate", what is meant is that the first and second radiating areas are separated from each other by a separating region so as to be electrically insulated.

According to one feature of the invention:
  each first planar antenna comprises separate first and second radiating areas;
  the first radiating areas of the first planar antennas are electrically connected to the vias and to the first active components;
  the second radiating areas of the first planar antennas are electrically connected to the first active components.

According to one feature of the invention, the substrate is chosen from:
  a substrate made based on a semiconductor or consisting of a semiconductor;
  a substrate made of a dielectric.

Definitions

By "based on", what is meant is that the semiconductor is the main material from which the substrate is mostly made.

By "semiconductor", what is meant is a material having an electrical conductivity at 300 K comprised between $10^{-8}$ S/cm and $10^{3}$ S/cm.

By "consisting of", what is meant is that the semiconductor is the only material from which the substrate is made.

By "dielectric", what is meant is a material having an electrical conductivity at 300 K lower than $10^{-8}$ S/cm.

According to one feature of the invention, the cured polymer is a thermoset, and preferably a polyepoxide.

One advantage thereof is that the layer of the cured polymer may be easily formed by moulding.

According to one feature of the invention, the layer of a cured polymer has a thickness comprised between 300 μm and 800 μm.

Definition

By "thickness", what is meant is the dimension along the normal to the first and second surfaces of the substrate.

One advantage thereof is that electronic chips (e.g. demultiplexers) may be encapsulated within the layer of a cured polymer.

Another subject of the invention is an integrated circuit fabricated by dicing a stack according to the invention normal to the first and second surfaces of the substrate, so as to obtain a plurality of elementary cells that is intended to perform an electromagnetic-lens function for a reconfigurable transmitarray antenna, each elementary cell comprising first and second planar antennas that are aligned along the normal to the first and second surfaces of the substrate.

Another subject of the invention is a reconfigurable transmitarray antenna, comprising:
  a printed circuit board having first and second opposite surfaces;
  at least one integrated circuit according to the invention, formed on the first surface of the printed circuit board;
  at least one transceiver, arranged to emit and receive an electromagnetic wave propagating within the printed circuit board;
  at least one electronic control device that is configured to control the transceiver and the first active components of the integrated circuit and that is formed on the second surface of the printed circuit board.

One advantage thereof is that a very compact reconfigurable transmitarray antenna may be obtained by integrating the electromagnetic lens and the electronic control device into the two opposite faces of a printed circuit board.

According to one feature of the invention, the electronic control device is configured to control the second active components of the integrated circuit.

According to one feature of the invention, the antenna comprises additional planar antennas that are formed on the first surface of the printed circuit board and that are aligned with the elementary cells of the integrated circuit along the normal to the first and second surfaces of the substrate.

One advantage thereof is that a transmitarray capable of managing independent beams may be obtained, for example for multi-user applications.

BRIEF DESCRIPTION OF THE DRAWINGS

Other features and advantages will become apparent from the detailed description of various embodiments of the invention, the description containing examples and references to the appended drawings.

It will be noted that the drawings described above are schematic, and have not been drawn to scale for the sake of legibility and to simplify the comprehension thereof.

DETAILED DESCRIPTION OF EMBODIMENTS

For the sake of simplicity, elements that are identical or that perform the same function in the various embodiments have been designated with the same references.

Stack

One subject of the invention is a stack 1 for fabricating an integrated circuit IC intended to perform an electromagnetic-lens function for a reconfigurable transmitarray antenna 2, the stack 1 comprising in succession:
  a substrate 3 that comprises a set of first active components C1 configured to generate a phase shift, and that has first and second opposite surfaces 30, 31, the first active components C1 being integrated monolithically into the substrate 3;
  a metal layer 4, forming a ground plane on the first surface 30 of the substrate 3;
  a layer of a cured polymer 5, formed on the metal layer 4;
the stack 1 comprising:
  a first interconnect structure 6 formed on the second surface 31 of the substrate 3, and electrically connected to the first active components C1, the first interconnect structure 6 comprising first biasing lines 60 arranged to bias the first active components C1;
  a set of first planar antennas A1 that is formed on the first interconnect structure 6 so as to be electrically connected to the first active components C1;
  a set of second planar antennas A2 that is formed on the layer of a cured polymer 5, the sets of first and second planar antennas A1, A2 being aligned along the normal to the first and second surfaces 30, 31 of the substrate 3;
  vias V that are electrically insulated from the metal layer 4 and that are arranged to electrically connect pairs of planar antennas, each electrically connected pair of planar antennas comprising first and second planar antennas A1, A2 that are aligned along the normal to the first and second surfaces 30, 31 of the substrate 3.

Various embodiments of the stack 1 are illustrated in FIGS. 1 to 4.

Substrate

The substrate 3 is advantageously chosen from:
  a substrate 3 made based on a semiconductor or consisting of a semiconductor;
  a substrate 3 made of a dielectric.

The semiconductor is preferably selected from silicon and germanium. The substrate 3 may be a semiconductor-on-insulator (SeOI) substrate but preferably is a silicon-on-insulator (SOI) substrate.

The dielectric is preferably selected from glass and quartz.

The substrate 3 may have a thickness comprised between 300 μm and 700 μm.

Set of First Active Components

The first active components C1 are advantageously integrated monolithically into the substrate 3 in the FEOL portion of a production line (FEOL being the acronym of front end of line) for example using photolithography techniques, etching techniques, dopant-implantation and -diffusion techniques, metal-deposition techniques and passivation techniques known to those skilled in the art. In the case where the substrate 3 is made of a dielectric, the first active components C1 may be integrated monolithically into the substrate 3 using thin-layer deposition techniques.

Each first planar antenna A1 advantageously comprises first and second radiating areas A10, A11 that are separate in the sense that they are separated from each other by a separating region so as to be electrically insulated from each other. The set of first active components C1 advantageously comprises pairs of switches, each pair of switches being associated with one first planar antenna A1. Each pair of switches belongs to one phase-shift-generating circuit, and comprises first and second switches that each switch between an on state and an off state in alternation, a flow of a current between the separate first and second radiating areas A10, A11 of each first planar antenna A1 being permitted in the on state and blocked in the off state. By "in alternation", what is meant is that the first switch alternates between the on state and the off state, while, simultaneously, the second switch alternates between the off state and the on state. In other words, at any given time, the first and second switches belonging to the same phase-shift-generating circuit have two opposing states, either on/off or off/on. On/on or off/off states are not permitted.

The first active components C1 are preferably chosen from a diode, a field-effect transistor, a bipolar transistor, and a micro-electromechanical system. The field-effect transistor is preferably a metal-oxide-semiconductor (MOS) transistor. The diode may be a p-i-n diode, a photodiode, or even a varactor. The p-i-n diodes may be made of AlGaAs.

First Interconnect Structure

The first interconnect structure 6 is advantageously formed on the second surface 31 of the substrate 3 in the BEOL portion of a production line (BEOL being the acronym of back end of line).

The first biasing lines 30 are metal tracks, which are preferably made of copper.

Set of First Planar Antennas

The set of first planar antennas A1 is formed on the first interconnect structure 6 in such a way that the first planar antennas A1 are electrically insulated from each other, in order not to be short-circuited.

Each first planar antenna A1 advantageously comprises first and second radiating areas A10, A11 that are separate in the sense that they are separated from each other by a separating region so as to be electrically insulated from each other. To this end, a slit is advantageously formed in each first planar antenna A1 in order to electrically insulate the separate first and second radiating areas A10, A11. The slit defines the separating region. The slit is preferably annular, with a rectangular cross section. Of course, other shapes may be contemplated for the slit, such as an elliptical or circular shape. According to one variant of execution, the first and second radiating areas A10, A11 of the first planar antenna A1 may be electrically insulated by a dielectric.

The first radiating areas A10 of the first planar antennas A1 are electrically connected to the vias V and to the first active components C1. The second radiating areas A11 of the first planar antennas A1 are electrically connected to the first active components C1.

Metal Layer

The metal layer 4 is preferably made of copper.

By way of nonlimiting example, the metal layer 4 may have a thickness of the order of 17 μm when the operating frequency of the transmitarray antenna 2 is 29 GHz.

The metal layer 4 may be formed on the first surface 30 of the substrate 3 using a metallization process such as growth by electrolysis through a resist mask from a seed layer.

Layer of a Cured Polymer

The cured polymer is advantageously a thermoset, and preferably a polyepoxide. The polyepoxide may be filled with silica beads.

The layer of a cured polymer 5 advantageously has a thickness comprised between 300 μm and 800 μm.

The layer of a cured polymer 5 is formed by moulding (in-mould lamination, compression moulding or injection moulding) on the metal layer 4.

Second Interconnect Structure

The stack 1 advantageously comprises a second interconnect structure 7 intermediate between the layer of a cured polymer 5 and the set of second planar antennas A2. The second interconnect structure 7 is advantageously formed on the layer of a cured polymer 5 in the BEOL portion of a production line (BEOL being the acronym of back end of line).

The layer of a cured polymer 5 then advantageously has a surface 50 that is oriented toward the second interconnect structure 7 and equipped with a set of second active components C2 that are configured to generate a phase shift.

The second interconnect structure 7 is electrically connected to the second active components C2 and comprises second biasing lines 70 that are arranged to bias the second active components C2. The second biasing lines 70 are metal tracks, which are preferably made of copper.

Set of Second Active Components

The second active components C2 are advantageously integrated monolithically into the layer of a cured polymer 5 in the FEOL portion of a production line, using wafer-level thin-layer deposition techniques.

Each second planar antenna A2 advantageously comprises first and second radiating areas A20, A21 that are separate in the sense that they are separated from each other by a separating region so as to be electrically insulated from each other. The set of second active components C2 advantageously comprises pairs of switches, each pair of switches being associated with one second planar antenna A2. Each pair of switches belongs to one phase-shift-generating circuit, and comprises first and second switches that each switch between an on state and an off state in alternation, a flow of a current between the separate first and second radiating areas A20, A21 of each second planar antenna A2 being permitted in the on state and blocked in the off state. By "in alternation", what is meant is that the first switch alternates between the on state and the off state, while, simultaneously, the second switch alternates between the off state and the on state. In other words, at any given time, the first and second switches belonging to the same phase-shift-generating circuit have two opposing states, either on/off or off/on. On/on or off/off states are not authorized.

The second active components C2 are preferably chosen from a diode, a field-effect transistor, a bipolar transistor, and a micro-electromechanical system. The field-effect transistor is preferably a metal-oxide-semiconductor (MOS) transistor. The diode may be a p-i-n diode, a photodiode, or even a varactor. The p-i-n diodes may be made from AlGaAs.

Set of Second Planar Antennas

In the presence of the second interconnect structure 7, the set of second planar antennas A2 is formed on the second interconnect structure 7 in such a way as to be electrically connected to the second active components C2. The set of second planar antennas A2 is formed on the second interconnect structure 7 in such a way that the second planar antennas A2 are electrically insulated from each other, in order not to be short-circuited.

Each second planar antenna A2 advantageously comprises first and second radiating areas A20, A21 that are separate in the sense that they are separated from each other by a separating region so as to be electrically insulated from each other. To this end, a slit is advantageously formed in each second planar antenna A2 in order to electrically insulate the separate first and second radiating areas A20, A21. The slit defines the separating region. The slit is preferably annular, with a rectangular cross section. Of course, other shapes may be contemplated for the slit, such as an elliptical or circular shape. According to one variant of execution, the first and second radiating areas A20, A21 of the second planar antenna A2 may be electrically insulated by a dielectric.

The first radiating areas A20 of the second planar antennas A2 are electrically connected to the vias V and to the second active components C2. The second radiating areas A21 of the second planar antennas A2 are electrically connected to the second active components C2.

The sets of first and second planar antennas A1, A2 are aligned along the normal to the first and second surfaces 30, 31 of the substrate 3. The alignment of the sets of first and second planar antennas A1, A2 may be obtained using an alignment technique known to those skilled in the art, and for example using CCD cameras (CCD being the acronym of charge-coupled device).

Demultiplexers

The stack 1 advantageously comprises demultiplexers DMUX that are encapsulated in the layer of a cured polymer 5 and that are off-axis with respect to the electrically connected pairs of planar antennas, the demultiplexers DMUX being electrically connected to the first biasing lines 60 with a view to transmission of a control signal. The demultiplexers DMUX are advantageously electrically connected to the second biasing lines 70. The electrical connections between the demultiplexers DMUX and the first and second biasing lines 60, 70 are not shown in the figures for the sake of simplicity and legibility.

The demultiplexers DMUX are advantageously encapsulated in the layer of a cured polymer 5 using a fan-out wafer-level packaging technique known to those skilled in the art.

Vias/Electrical Connections Between the Planar Antennas

The vias V pass through openings formed in the metal layer 4. The openings formed in the metal layer 4 not only allow the vias V to be electrically insulated but also electromagnetic waves to propagate through the metal layer 4 forming the ground plane. When the substrate 3 is made of silicon, the vias V passing through the substrate 3 are through-silicon vias (TSVs). The vias V passing through the layer of a cured polymer 5 are through-mould vias (TMVs), the cured polymer 5 being moulded, and may be formed on the metal layer 4 using an electrodeposition technique known to those skilled in the art. By way of example, for an operating frequency of 29 GHz, the vias V have a diameter of the order of 150 µm. The vias V are preferably connected to the first and second planar antennas A1, A2 by connection points. Generally, the position of the connection points is chosen, depending on the specific geometry of the planar antennas, so that the fundamental resonant mode is excited. The vias V advantageously extend normal to the surfaces of the first and second planar antennas A1, A2.

Integrated Circuit

One subject of the invention is an integrated circuit IC fabricated by dicing a stack 1 according to the invention normal to the first and second surfaces 30, 31 of the substrate 3, so as to obtain a plurality of elementary cells CE that is intended to perform an electromagnetic-lens function for a reconfigurable transmitarray antenna 2, each elementary cell CE comprising first and second planar antennas A1, A2 that are aligned along the normal to the first and second surfaces 30, 31 of the substrate 3.

The dicing may be carried out using a precision circular saw, with a resin- or metal-bonded diamond blade.

Figure 1:
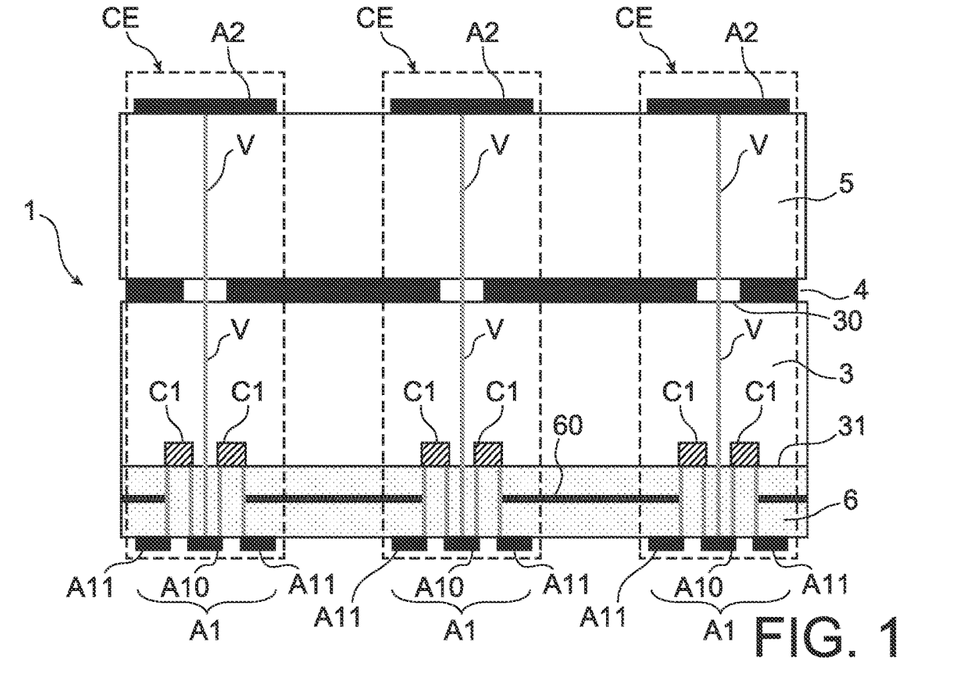
FIG. 1 is a cross-sectional partial schematic view illustrating a first embodiment of a stack according to the invention. The dashed lines indicate one elementary cell.
Figure 2:
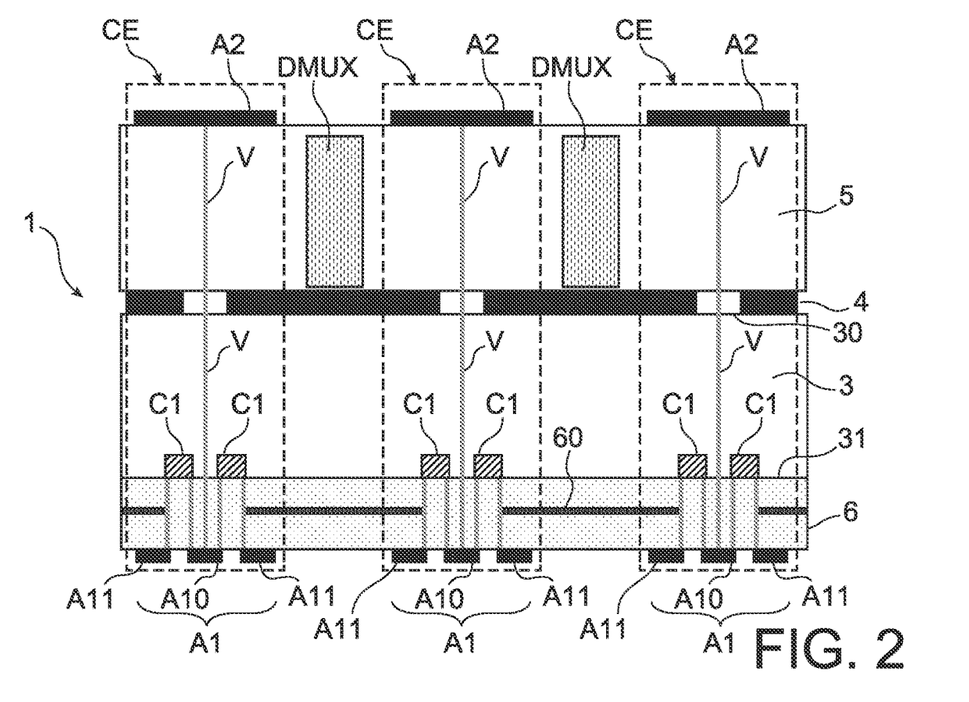
FIG. 2 is a cross-sectional partial schematic view illustrating a second embodiment of a stack according to the invention. The dashed lines indicate one elementary cell.
Figure 3:
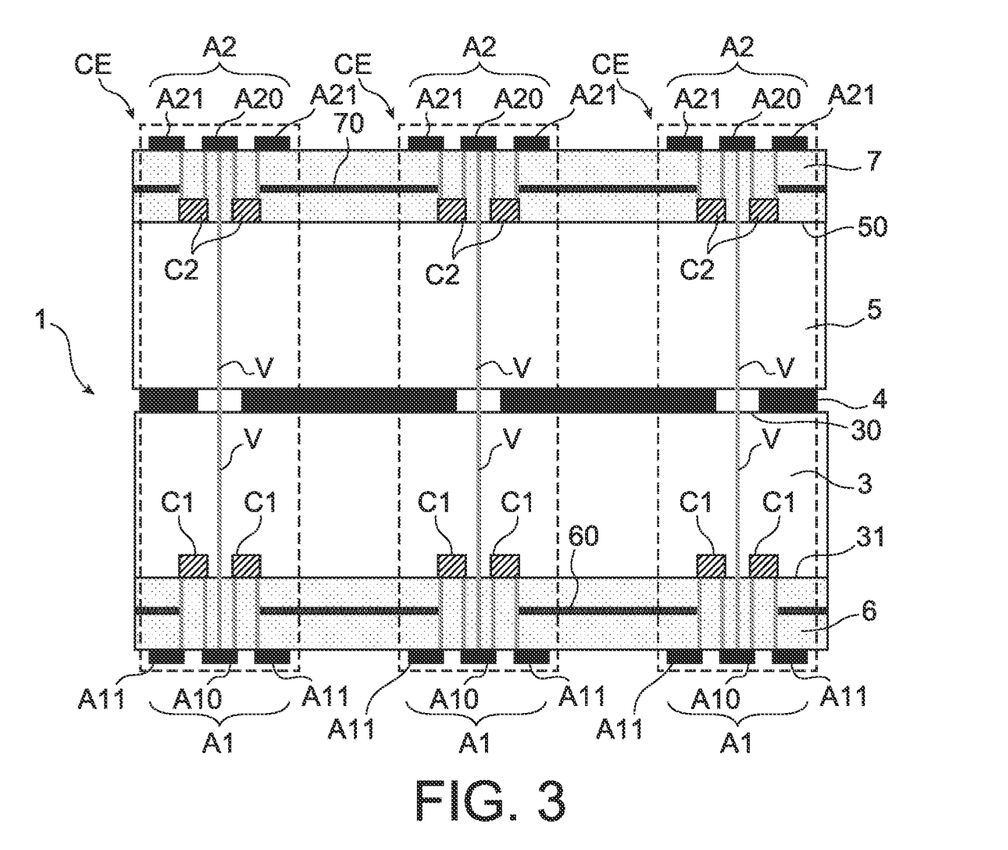
FIG. 3 is a cross-sectional partial schematic view illustrating a third embodiment of a stack according to the invention. The dashed lines indicate one elementary cell.
Figure 4:
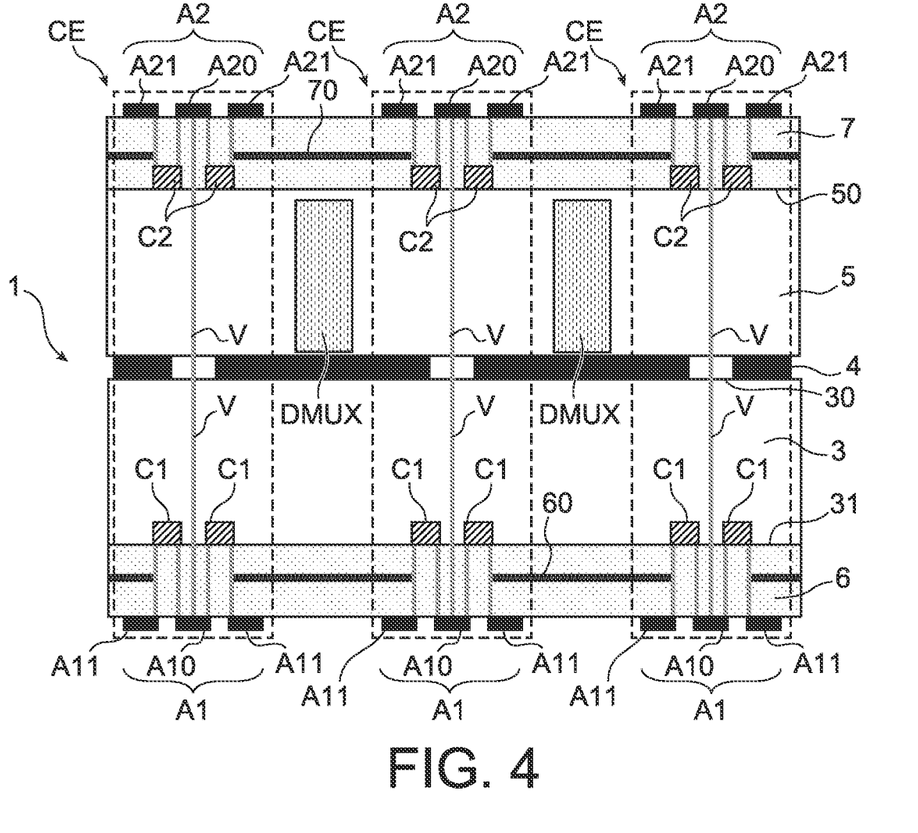
FIG. 4 is a cross-sectional partial schematic view illustrating a fourth embodiment of a stack according to the invention. The dashed lines indicate one elementary cell.
Figure 5:
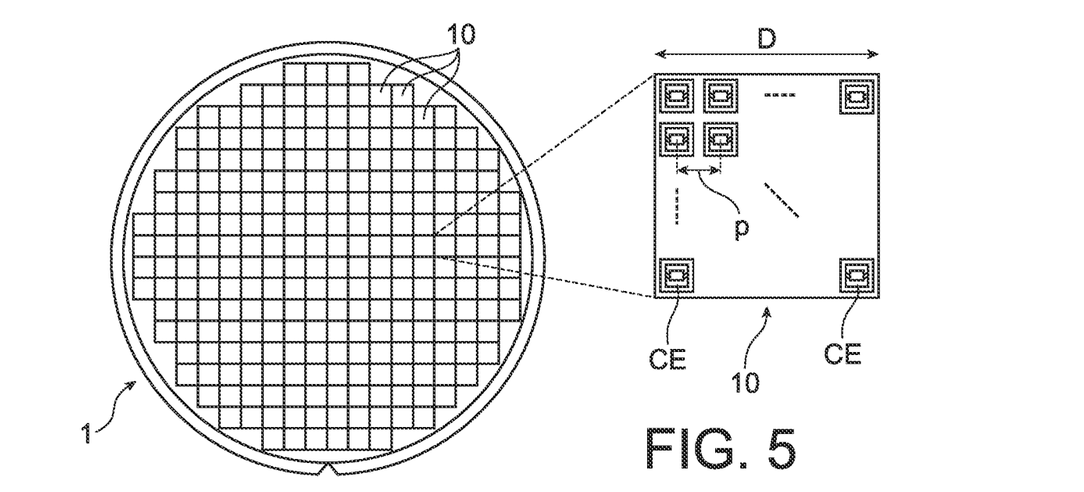
FIG. 5 is a schematic view from above of a stack according to the invention, illustrating the formation of patterns on the surface of the stack, for example by photolithography using a mask (reticle). The detail in FIG. 5 is a view from above at larger scale of one pattern, formed on the surface of the stack, and comprising a plurality of elementary cells.

Before the dicing, the surface of the stack 1 is divided into patterns 10, as illustrated in FIG. 5. The patterns 10 are formed on the surface of the stack 1, for example by photolithography using a mask (reticle). By way of non-limiting example, each pattern 10 may be of square shape (D being the length of the sides) and may have an area of 20×20 mm$^2$ when the substrate 3 has a diameter of 200 mm. The number of elementary cells CE present in a pattern 10 depends on the operating frequency of the antenna 2, which defines the pitch p of the elementary cells CE. By way of nonlimiting example, for an operating frequency of 28 GHz, a square pattern 10 with an area of 20×20 mm$^2$ may comprise 3×3 elementary cells CE.

Reconfigurable Antenna

Figure 6:
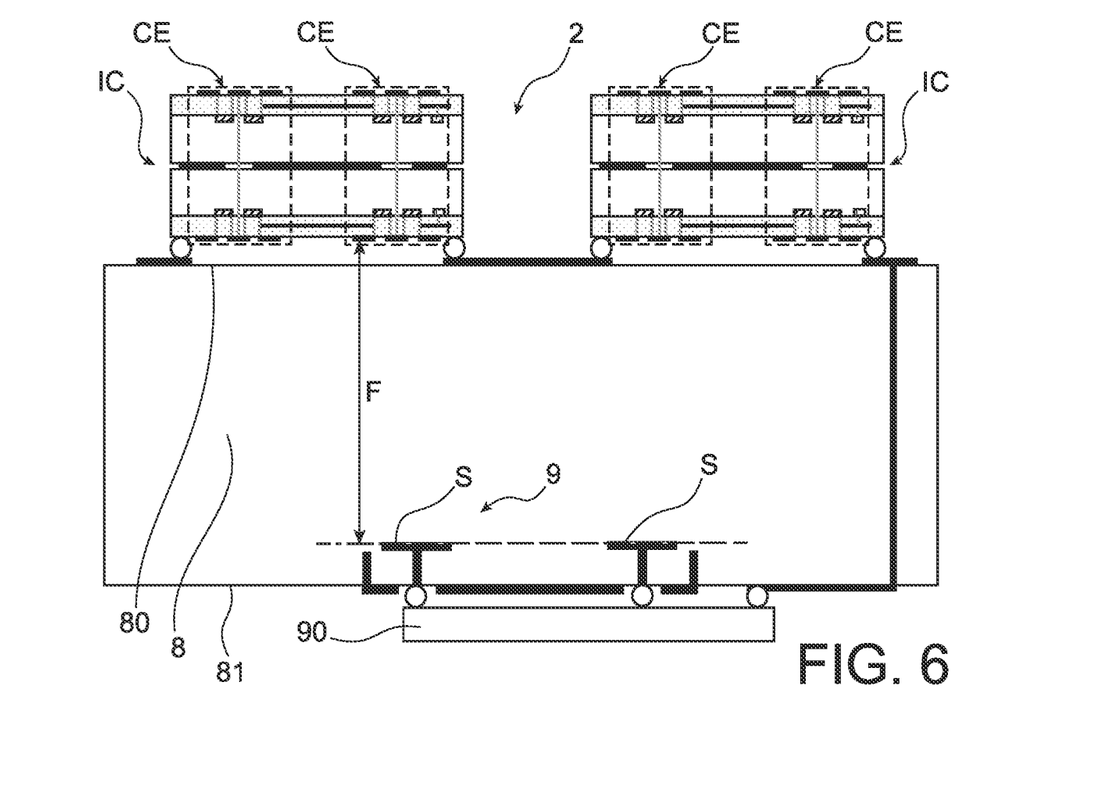
FIG. 6 is a cross-sectional schematic view of a reconfigurable antenna according to the invention.

As illustrated in FIG. 6, one subject of the invention is a reconfigurable transmitarray antenna 2, comprising:
- a printed circuit board 8 having first and second opposite surfaces 80, 81;
- at least one integrated circuit IC according to the invention, formed on the first surface 80 of the printed circuit board 8;
- at least one transceiver 9, arranged to emit and receive an electromagnetic wave propagating within the printed circuit board 8;
- at least one electronic control device 90 that is configured to control the transceiver 9 and the first active components C1 of the integrated circuit IC and that is formed on the second surface 81 of the printed circuit board 8.

Printed Circuit Board

The printed circuit board 8 is made of a dielectric. By way of non-limiting example, the printed circuit board 8 may be made of a commercially available material such as RT/Duroid® 6002. The printed circuit board 8 has a thickness that is typically comprised between 100 µm and 1500 µm for an operating frequency of the antenna 2 comprised between 10 GHz and 300 GHz. By way of non-limiting example, the printed circuit board 8 may have a thickness of the order of 254 µm when the operating frequency of the antenna 2 is 29 GHz.

Figure 7:
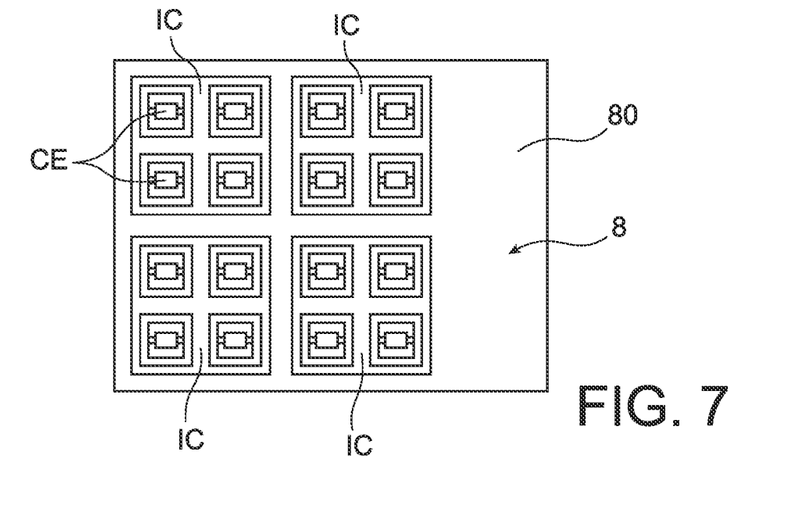
FIG. 7 is a schematic view from above of a reconfigurable antenna according to the invention.

The one or more integrated circuits IC may be formed on the first surface 80 of the printed circuit board 8 using a flip-chip assembly technique. The integrated circuits IC may be arranged on the first surface 80 of the printed circuit board 8 in a matrix array, as illustrated in FIG. 7.

Figure 8:
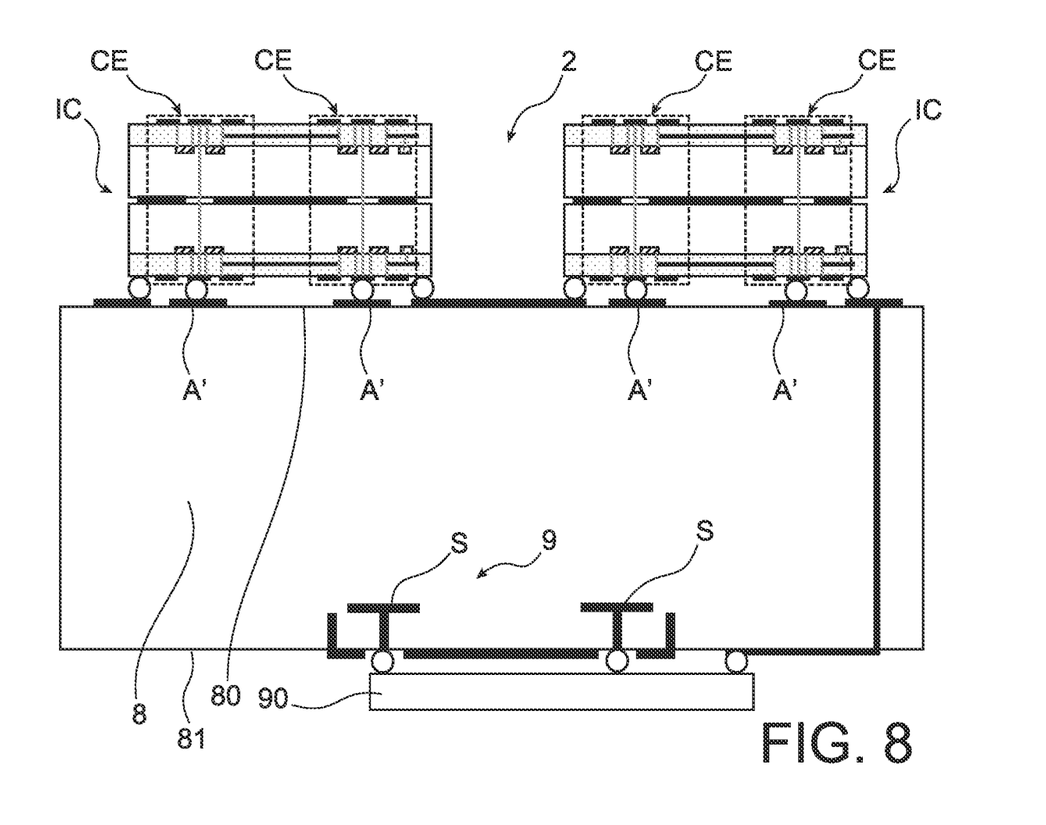
FIG. 8 is a cross-sectional schematic view of a reconfigurable antenna according to the invention, illustrating one embodiment in which additional planar antennas are formed on the surface of the printed circuit board.

As illustrated in FIG. 8, the antenna 2 advantageously comprises additional planar antennas A' that are formed on the first surface 80 of the printed circuit board 8 and that are aligned with the elementary cells CE of the integrated circuit IC along the normal to the first and second surfaces 30, 31 of the substrate 3.

Transceiver

Each transceiver 9 comprises at least one radiating source S arranged to emit electromagnetic waves. The radiating source S may take the form of a planar antenna that is formed within the printed circuit board 8 and that lies in a focal plane the Euclidean distance of which to the electromagnetic lens defines the focal length F (which is illustrated in FIG. 6). The or each radiating source S is advantageously configured to operate at a frequency above 30 GHz (millimetre and sub-THz frequencies).

Figure 9:
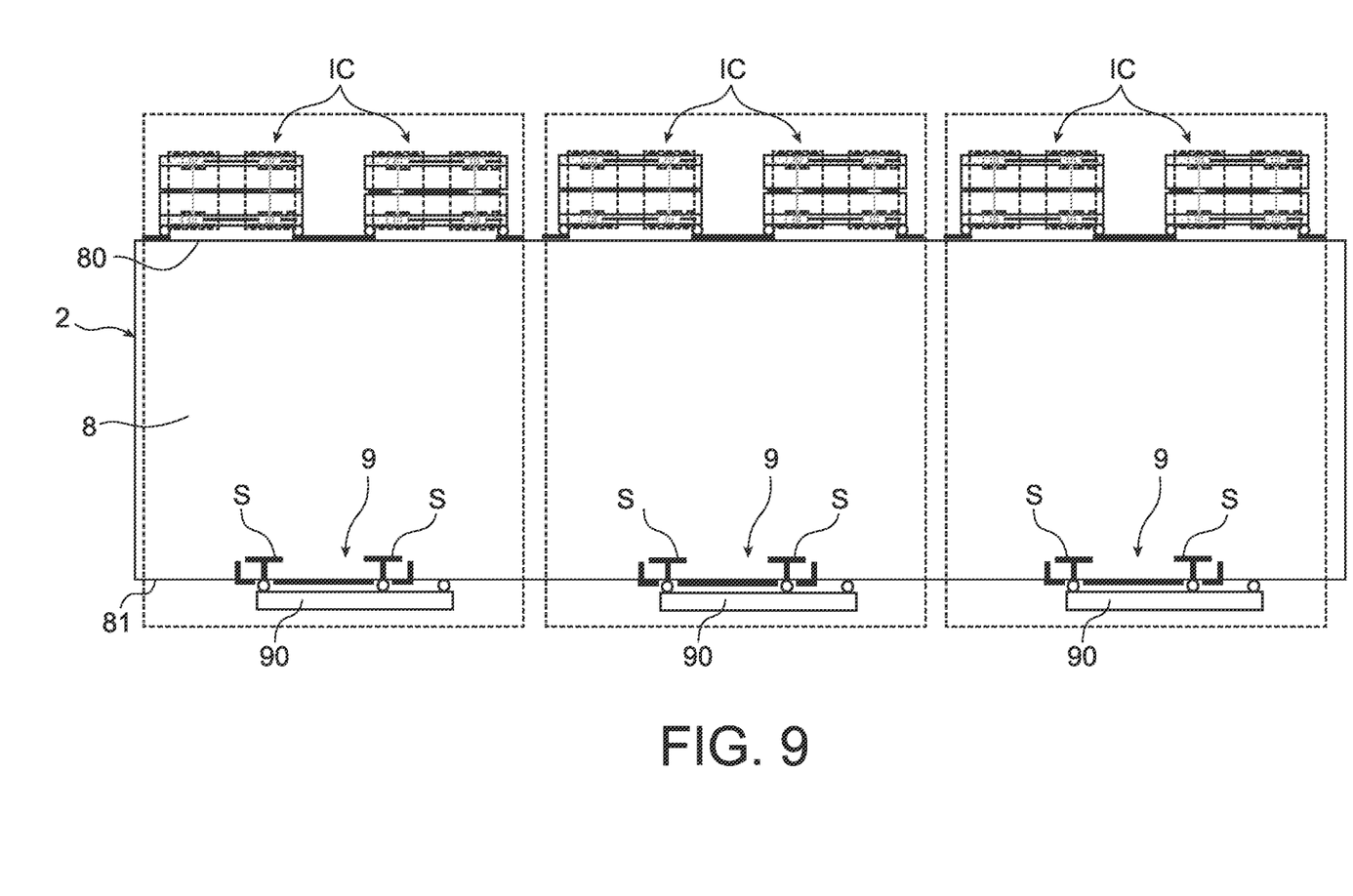
FIG. 9 is a cross-sectional schematic view of a reconfigurable antenna according to the invention, illustrating one embodiment in which the printed circuit board is equipped with a plurality of transceiver modules. The dot-dashed lines indicate a region of formation of a beam in a passband.

As illustrated in FIG. 9, the antenna 2 may comprise a plurality of transceivers 9. When the integrated circuits IC are arranged on the first surface 80 of the printed circuit board 8 in a matrix array, each transceiver 9 may be dedicated to one region of the matrix array.

Figure 10:
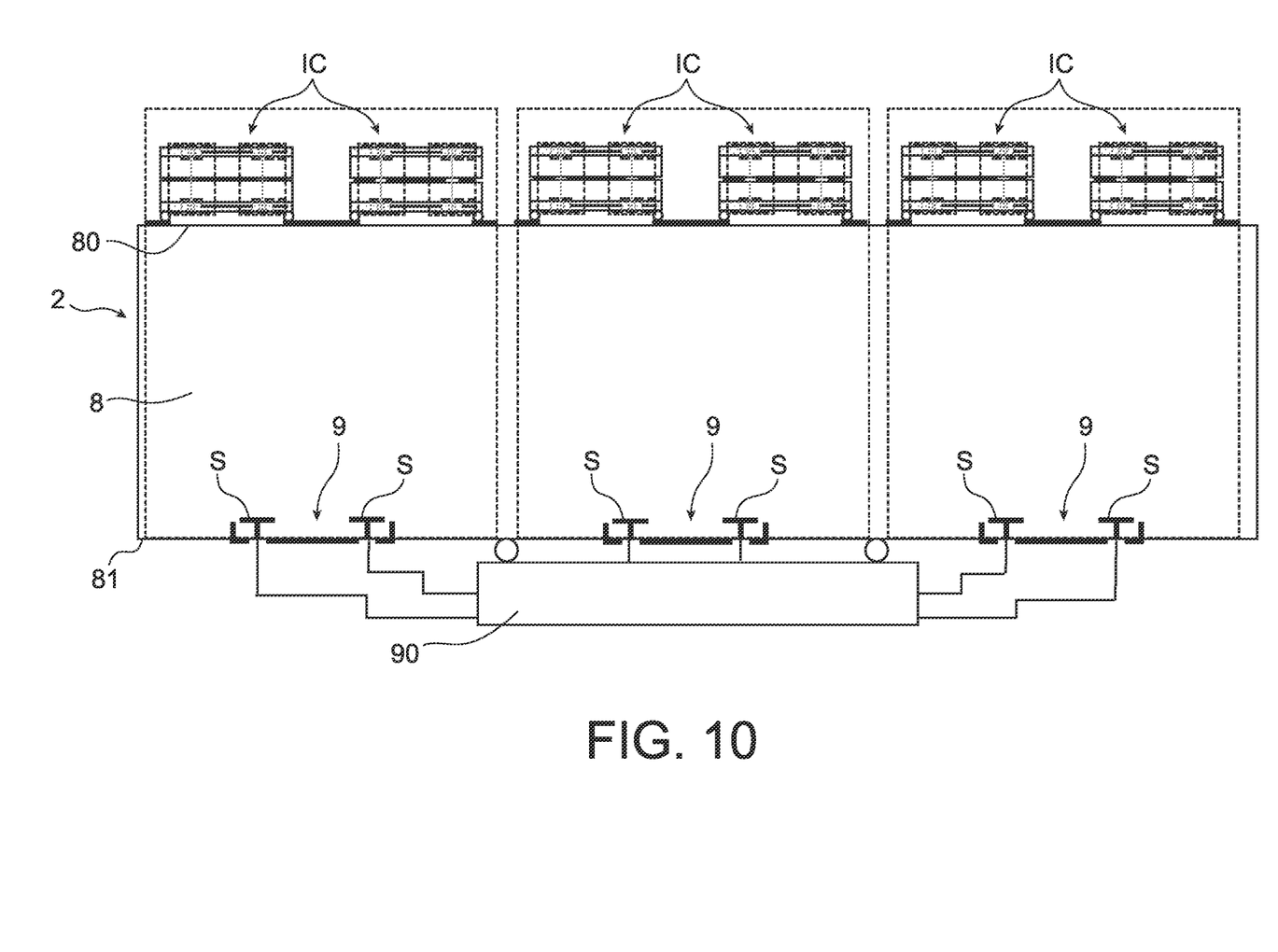
FIG. 10 is a cross-sectional schematic view of a reconfigurable antenna according to the invention, illustrating one embodiment in which the printed circuit board is equipped with one digital transceiver module. The dot-dashed lines indicate a region of formation of a beam in a passband.

As illustrated in FIG. 10, the plurality of transceivers 9 may be controlled by a digital electronic control device 90 the output channels of which are electrically connected to the radiating sources S.

Electronic Control Device

The electronic control device 90 is preferably integrated into an electronic chip mounted on the second surface 81 of the printed circuit board 8. The electronic control device 90 is advantageously configured to control the second active components C2 of the integrated circuit IC.

In the absence of demultiplexers DMUX encapsulated in the layer of a cured polymer 5, demultiplexers may be located remotely within the electronic control device 90. One example of the way in which the biasing lines may be controlled is given in the doctoral thesis "Conception d'antennes à réseaux transmetteurs à dépointage et/ou formation de faisceau" [Design of beam-pointing and/or beam-forming transmitarray antennas], A. Clemente, October 2012, on pages 159-161.

The invention is not limited to the disclosed embodiments. Anyone skilled in the art will be able to consider the technically workable combinations thereof, and to substitute equivalents therefor.

The invention claimed is:

1. A stack for fabricating an integrated circuit to perform an electromagnetic-lens function for a reconfigurable transmitarray antenna, the stack comprising in succession:
    a substrate, including a set of first active components configured to generate a phase shift, the substrate having first and second opposite surfaces, the first active components being integrated monolithically into the substrate;
    a metal layer, forming a ground plane on the first surface of the substrate; and
    a layer of a cured polymer, formed on the metal layer, the stack further comprising:
        a first interconnect structure formed on the second surface of the substrate, and electrically connected to the first active components, the first interconnect structure including first biasing lines arranged to bias the first active components;
        a set of first planar antennas, formed on the first interconnect structure so as to be electrically connected to the first active components;
        a set of second planar antennas, formed on the layer of the cured polymer, the sets of first and second planar antennas being aligned along a normal to the first and second surfaces of the substrate;
        a plurality of vias, electrically insulated from the metal layer, and arranged to electrically connect pairs of planar antennas, each electrically connected pair of planar antennas including first and second planar antennas that are aligned along the normal to the first and second surfaces of the substrate.

2. The stack according to claim 1, further comprising demultiplexers that are encapsulated in the layer of the cured polymer and that are off-axis with respect to the electrically connected pairs of planar antennas, the demultiplexers being electrically connected to the first biasing lines so as to transmit a control signal.

3. The stack according to claim 1, wherein the set of first active components comprises pairs of switches, each pair of switches being associated with one first planar antenna.

4. The stack according to claim 1, further comprising a second interconnect structure arranged between the layer of the cured polymer and the set of second planar antennas, wherein:
    the layer of the cured polymer has a surface that is oriented toward the second interconnect structure, said surface being equipped with a set of second active components that are configured to generate a phase shift;
    the second interconnect structure is electrically connected to the second active components and includes second biasing lines that are arranged to bias the second active components; and
    the set of second planar antennas is formed on the second interconnect structure so as to be electrically connected to the second active components.

5. The stack according to claim 4, wherein the set of second active components includes pairs of switches, each pair of switches being associated with one second planar antenna.

6. The stack according to claim 4, further comprising demultiplexers that are encapsulated in the layer of the cured polymer and that are off-axis with respect to the electrically connected pairs of planar antennas,
    wherein the demultiplexers are electrically connected to the second biasing lines.

7. The stack according to claim 4, wherein:
    each second planar antenna of the set of second planar antennas includes separate first and second radiating areas;
    the first radiating areas of the set of second planar antennas are electrically connected to the vias and to the second active components; and
    the second radiating areas of the set of second planar antennas are electrically connected to the second active components.

8. The stack according to claim 1, wherein:
    each first planar antenna of the set of first planar antennas comprises separate first and second radiating areas;
    the first radiating areas of the set of first planar antennas are electrically connected to the vias and to the first active components; and
    the second radiating areas of the set of first planar antennas are electrically connected to the first active components.

9. The stack according to claim 1, wherein the substrate is one of:
    a substrate made based on a semiconductor or consisting of a semiconductor; and
    a substrate made of a dielectric.

10. The stack according to claim 1, wherein the cured polymer is a thermoset.

11. The stack according to claim 1, wherein the layer of the cured polymer has a thickness between 300 µm and 800 µm.

12. An integrated circuit fabricated by dicing the stack according to claim 1 normal to the first and second surfaces of the substrate, so as to obtain a plurality of elementary cells to perform the electromagnetic-lens function for the reconfigurable transmitarray antenna, each elementary cell comprising first and second planar antennas that are aligned along the normal to the first and second surfaces of the substrate.

13. A reconfigurable transmitarray antenna, comprising:
    a printed circuit board having first and second opposite surfaces;
    at least one integrated circuit according to claim 12, formed on the first surface of the printed circuit board;
    at least one transceiver, arranged to emit and receive an electromagnetic wave propagating within the printed circuit board; and
    at least one electronic control device configured to control the at least one transceiver and the first active components of the at least one integrated circuit, the at least one electronic control device being formed on the second surface of the printed circuit board.

14. The reconfigurable transmitarray antenna according to claim 13, wherein:
    the at least one integrated circuit is fabricated by dicing the stack; and
    the at least one electronic control device is configured to control the second active components of the at least one integrated circuit.

15. The reconfigurable transmitarray antenna according to claim 13, further comprising additional planar antennas that are formed on the first surface of the printed circuit board and that are aligned with the elementary cells of the at least one integrated circuit along the normal to the first and second surfaces of the substrate.

\* \* \* \* \*